United States Patent
Divate et al.

(10) Patent No.: US 6,970,806 B1
(45) Date of Patent: Nov. 29, 2005

(54) METHOD AND SYSTEM FOR TESTING ARTICLES OF MANUFACTURE

(75) Inventors: Vinayak Divate, Nonthaburi (TH); Pichit Saengpongpaew, Nonthaburi (TH); Jitrayut Junnapart, Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 48 days.

(21) Appl. No.: 10/703,860

(22) Filed: Nov. 7, 2003

(51) Int. Cl.[7] .............................................. G06F 11/30
(52) U.S. Cl. .................... 702/183; 702/119; 702/186; 700/121; 714/719
(58) Field of Search ................ 702/183, 81, 119, 702/181, 186, 118; 714/719; 700/108, 95, 700/96, 110, 121

(56) References Cited

U.S. PATENT DOCUMENTS

| | | | |
|---|---|---|---|
| 6,154,714 A * | 11/2000 | Lepejian | 702/118 |
| 6,175,417 B1 * | 1/2001 | Do et al. | 356/392 |
| 6,751,514 B2 * | 6/2004 | Ando | 700/109 |

* cited by examiner

*Primary Examiner*—Bryan Bui
*Assistant Examiner*—Hien Vo
(74) *Attorney, Agent, or Firm*—Monica H. Choi

(57) ABSTRACT

A data processor automatically analyzes test data after a small subset of the lot of IC packages has been tested for determining whether a rescreen condition has occurred in real-time. When the rescreen condition has occurred, a warning is provided in real-time shortly after testing of the small subset. Thus, time is not wasted in testing the whole lot of articles with the rescreen condition, and a small number of failed articles is retested after the rescreen condition is corrected thus maximizing tester utilization.

34 Claims, 9 Drawing Sheets

234

| | | | | | | |
|---|---|---|---|---|---|---|
| 236 → ABC123 | 0 | 0 | 0 | 0 | 0 | 0 |
| 238 → ABC123 | 2 | 2 | 25 | 2 | 2 | 2 |
| 240 → ABC123 | 2 | 3 | 2 | 2 | 32 | 2 |
| 242 → ABC123 | 2 | 2 | 2 | 2 | 2 | 2 |
| 244 → ABC123 | 4 | 2 | 2 | 2 | 17 | 2 |
| 246 → ABC123 | 2 | 2 | 2 | 2 | 2 | 9 |
| 248 → ABC123 | 2 | 30 | 2 | 2 | 2 | 2 |

| Lot No. ABC123 ||
|---|---|
| Bin # | Acceptable Yield |
| 1 | >10% |
| 2 | >55% |
| ⋮ | ⋮ |
| 6 | <8% |
| 7 | <5% |
| ⋮ | ⋮ |
| Total Yield | >80% |

FIG. 5

| | | | | | | | |
|---|---|---|---|---|---|---|---|
| 236 → | ABC123 | 0 | 0 | 0 | 0 | 0 | 0 |
| 238 → | ABC123 | 2 | 2 | 25 | 2 | 2 | 2 |
| 240 → | ABC123 | 2 | 3 | 2 | 31 | 31 | 31 |
| 242 → | ABC123 | 31 | 31 | 31 | 31 | 31 | 31 |
| 244 → | ABC123 | 31 | 31 | 31 | 31 | 31 | 31 |
| 246 → | ABC123 | 31 | 31 | 31 | 31 | 31 | 31 |
| 248 → | ABC123 | 31 | 31 | 31 | 31 | 31 | 31 |

| | | | | | | | |
|---|---|---|---|---|---|---|---|
| 236 → | ABC123 | 0 | 0 | 0 | 0 | 0 | 0 |
| 238 → | ABC123 | 2 | 2 | 25 | 2 | 2 | 2 |
| 240 → | ABC123 | 2 | 3 | 2 | 2 | 32 | 2 |
| 242 → | ABC123 | 2 | 2 | 2 | 2 | 2 | 2 |
| 244 → | ABC123 | 22 | 22 | 22 | 22 | 22 | 22 |
| 246 → | ABC123 | 2 | 2 | 2 | 2 | 2 | 9 |
| 248 → | ABC123 | 2 | 30 | 2 | 2 | 2 | 2 |

|     | 234 |   |   |   |   |   |
|---|---|---|---|---|---|---|
| 236 → ABC123 | 0 | 0 | 0 | 0 | 0 | 0 |
| 238 → ABC123 | 20 | 2 | 25 | 2 | 2 | 2 |
| 240 → ABC123 | 20 | 3 | 2 | 2 | 32 | 2 |
| 242 → ABC123 | 20 | 2 | 2 | 2 | 2 | 2 |
| 244 → ABC123 | 20 | 2 | 2 | 2 | 17 | 2 |
| 246 → ABC123 | 20 | 2 | 2 | 2 | 2 | 9 |
| 248 → ABC123 | 20 | 30 | 2 | 2 | 2 | 2 |

FIG. 10

|     | 234 |   |   |   |   |   |
|---|---|---|---|---|---|---|
| 236 → ABC123 | 0 | 0 | 0 | 0 | 0 | 0 |
| 238 → ABC123 | 15 | 15 | 15 | 15 | 15 | 15 |
| 240 → ABC123 | 15 | 15 | 15 | 15 | 15 | 15 |
| 242 → ABC123 | 15 | 15 | 15 | 15 | 15 | 15 |
| 244 → ABC123 | 15 | 15 | 15 | 15 | 15 | 15 |
| 246 → ABC123 | 15 | 15 | 15 | 15 | 15 | 15 |
| 248 → ABC123 | 15 | 15 | 15 | 15 | 15 | 15 |

FIG. 11

| | | | | | | |
|---|---|---|---|---|---|---|
| 236→ABC123 | 0 | 0 | 0 | 0 | 0 | 0 |
| 238→ABC123 | 20 | 2 | 20 | 20 | 20 | 2 |
| 240→ABC123 | 20 | 20 | 2 | 20 | 20 | 20 |
| 242→ABC123 | 2 | 20 | 20 | 20 | 20 | 20 |
| 244→ABC123 | 20 | 20 | 20 | 20 | 12 | 20 |
| 246→ABC123 | 20 | 20 | 20 | 20 | 20 | 2 |
| 248→ABC123 | 20 | 20 | 14 | 20 | 20 | 20 |

234

| Lot No. | Final Yield | Yield at 1420 |
|---------|-------------|---------------|
| ABC000  | 78          | 75            |
| EFG111  | 86          | 83            |
| HIJ222  | 82          | 79            |
| KLM333  | 83          | 80            |
| NOP444  | 75          | 71            |
| QRS555  | 78          | 74            |

METHOD AND SYSTEM FOR TESTING ARTICLES OF MANUFACTURE

TECHNICAL FIELD

The present invention relates generally to testing articles of manufacture such as IC (integrated circuit) packages, and more particularly, to a method and system for monitoring for occurrence of a rescreen condition in real-time to maximize tester utilization.

BACKGROUND OF THE INVENTION

The present invention is described for testing IC (integrated circuit) packages during manufacture of IC packages. However, the present invention may be applied for testing any articles of manufacture.

FIG. 1 show a flowchart of steps for testing IC packages within a tester that assigns each tested IC package to a respective one of a plurality of distribution bins. One example of such a tester is available from Advantest Corp. headquartered in Tokyo, Japan with a regional headquarter in Santa Clara, Calif. Each distribution bin is associated with a test result condition.

For example, a tested IC package may be assigned to distribution bin #1 when the IC package passes testing with a first operating current, to distribution bin #2 when the IC package passes testing with a second operating current, and so on to distribution bin #5 when the IC package passes testing with a fifth operating current. Or, the IC package may be assigned to distribution bin #6 when the IC package fails testing because a short circuit is detected, to distribution bin #7 when the IC package fails testing because an open circuit is detected, to distribution bin #8 when the IC package fails testing because a level of current flowing through the IC package is greater than an acceptable level, and so on.

Referring to FIG. 1, an insertion unit of IC packages is tested at a time by the tester (step 102 of FIG. 1). For example, the insertion unit of the tester may have thirty-two sockets for holding and testing thirty-two IC packages at a time. After testing of the thirty-two IC packages, the tester generates distribution bin data including assignment of a respective one of the plurality of bins for each of the tested IC packages (step 104 of FIG. 1).

IC packages are typically manufactured in a lot with a lot size of thousands of IC packages such as 7,000 IC packages for example. If the whole lot of IC packages has not yet been tested (step 106 of FIG. 1), then the tester tests a next insertion unit of IC packages to repeat steps 102 and 104 with the next insertion unit of IC packages. Steps 102, 104, and 106 are repeated for each insertion unit of IC packages at a rate of three times per minute until the whole lot of IC packages has been tested.

When the whole lot of IC packages has been tested (step 108 of FIG. 1), summary test data is generated (step 108 of FIG. 1) for the whole lot of IC packages. Such summary test data includes a yield percentage of IC packages for each distribution bin and a total yield percentage of IC packages passing the test.

In the prior art, the whole lot of IC packages are first tested according to the flowchart of FIG. 1. Then, a production engineer reviews the summary test data to determine whether the yield percentages are acceptable. If such yield percentages are not acceptable, the production engineer attempts to correct for any conditions leading to test failure, and the failed IC packages are retested in a rescreen process. For example, the production engineer may check and correct for conditions of socket failure, device mixing, and incorrect die or accessory attachment to the tester.

Thus, in the prior art, the production engineer who analyzes the summary test data is required to be highly skilled and may still make an error in human judgment in deciding disposition of the lot of tested IC packages. Furthermore, during IC package manufacture, many different types of IC packages for diverse IC products are tested. The production engineer is required to keep track of different criteria for analyzing the summary test data for numerous different types of IC products.

Furthermore, in the prior art, the summary test data is analyzed after the whole lot of IC packages are tested. Such testing of the whole lot may require a relatively long period of time such as even 10–20 hours for example. In addition, as IC products are becoming more complicated in structure and operation, the time period required for testing the whole lot of IC packages is ever increasing. If a substantial majority of the lot of IC packages fails testing, a large number of such failed IC packages are retested again.

A rescreen condition occurs during testing and results in a substantial majority of the IC packages failing but not because of the IC package being faulty. Examples of rescreen conditions include device mixing (where unintended IC packages are tested), insertion failure (where the IC packages are inserted into the sockets of the tester with wrong orientation), socket failure (where a socket within the tester is faulty), wrong die or fixture installation (where a wrong part that does not correspond to the tested IC package is installed onto the tester), and a bug in the tester program (where an improper level of test current is sourced into the IC package by the tester).

In the prior art, occurrence of a rescreen condition is not determined until the whole lot of IC packages has been tested. As a result, in the prior art, substantial time and tester utilization is wasted for first testing the whole lot of IC packages and second for retesting a substantial majority of the IC packages after occurrence of the rescreen condition.

Thus, a mechanism is desired for automatically determining occurrence of a rescreen condition more immediately in real-time long before the whole lot of IC packages is tested. Such a mechanism maximizes tester utilization in testing for actual operation of the IC packages.

SUMMARY OF THE INVENTION

Accordingly, in a general aspect of the present invention, a data processor automatically analyzes test data after a small subset of the lot of IC packages has been tested for determining whether a rescreen condition has occurred in real-time. When the rescreen condition has occurred, a warning is provided in real-time shortly after testing of the small subset.

In another embodiment of the present invention, information and advice for handling the rescreen condition is also provided. Furthermore, the occurrence of the rescreen condition is checked after testing of each incremental small subset of the lot. For example, the incremental small subset is X% of the whole lot with X% being less than 2% of the whole lot. In a further embodiment of the present invention, the data processor determines whether at least one of a plurality of rescreen conditions has occurred. Typically upon occurrence of the rescreen condition, the rescreen condition is corrected, and the failed articles are retested after correcting for the rescreen condition.

In this manner, the occurrence of the rescreen condition is detected and corrected in real-time after testing each incremental small subset of the articles. Thus, time is not wasted in testing the whole lot of articles with the rescreen condition. In addition, a smaller number of failed articles are retested after the rescreen condition is corrected. Thus, tester utilization is maximized.

In another embodiment of the present invention, the data processor automatically downloads and analyzes distribution bin data from an IC (integrated circuit) package tester. Thus, the occurrence of the rescreen condition is automatically determined such that a production engineer who is skilled but may still make an error in human judgment is no longer required.

These and other features and advantages of the present invention will be better understood by considering the following detailed description of the invention which is presented with the attached drawings.

BRIEF DESCRIPTION OF THE DRAWINGS

FIG. 4 shows an example data file indicating assignment of each tested IC package to one of a plurality of distribution bins by a tester of FIG. 2;

FIG. 5 shows an example entry of acceptable yield data in a database of FIG. 2, according to an embodiment of the present invention;

FIG. 8 shows an example data file with the pattern of assignment of distribution bins indicating a rescreen condition of device mixing;

FIG. 9 shows an example data file with the pattern of assignment of distribution bins indicating a rescreen condition of insertion failure;

FIG. 10 shows an example data file with the pattern of assignment of distribution bins indicating a rescreen condition of socket failure;

FIG. 11 shows an example data file with the pattern of assignment of distribution bins indicating a rescreen condition of wrong fixture or die installation;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, and 15 refer to elements having similar structure and function.

DETAILED DESCRIPTION

The present invention is described in reference to testing IC (integrated circuit) packages during manufacture of IC packages. However, the present invention may be applied for testing any articles of manufacture, as would be apparent to one of ordinary skill in the art from the description herein.

Figure 2:
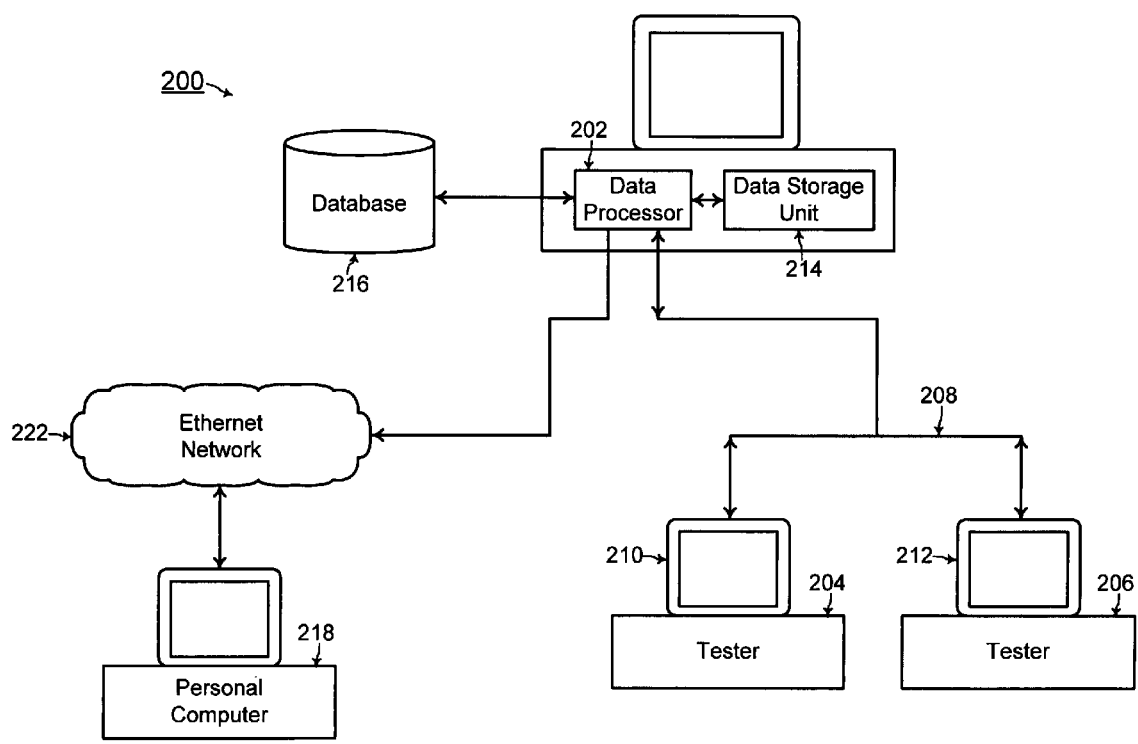
FIG. 2 shows a block diagram of a system for determining the occurrence of a rescreen condition in real-time during testing of IC packages, according to an embodiment of the present invention.

FIG. 2 shows a block diagram of a system 200 for automatically determining the occurrence of a rescreen condition in real time, according to an embodiment of the present invention. Referring to FIG. 2, the system 200 includes a data processor 202 coupled to a plurality of testers 204 and 206 via a tester interface 208.

The testers 204 and 206 test for proper operation of IC packages and assign each IC package to a respective one of a plurality of distribution bins after testing. One example of such a tester is available from Advantest Corp. headquartered in Tokyo, Japan with a regional headquarter in Santa Clara, Calif. Each distribution bin is associated with a test result condition, as described in the "background of the invention" herein. The first tester 204 has a first display 210, and the second tester 206 has a second display 212, for displaying information during testing of IC packages.

For example, an IC package may be assigned to distribution bin #1 when the IC package passes testing with a first operating current, to distribution bin #2 when the IC package passes testing with a second operating current, and so on to distribution bin #5 when the IC package passes testing with a fifth operating current. Or, the IC package may be assigned to distribution bin #6 when the IC package fails testing because a short circuit is detected, to distribution bin #7 when the IC package fails testing because an open circuit is detected, to distribution bin #8 when the IC package fails testing because a level of current flowing through the IC package is greater than an acceptable level, and so on.

The data processor 202 is coupled to a data storage unit 214 that stores data and instructions to be executed by the data processor 202 and that may also store temporary variables during execution of instructions by the data processor 202. For example, the data processor 202 and the data storage unit 214 may be components of a computer system as known to one of ordinary skill in the art. The data storage unit 214 may include a static storage device of the computer system such as a ROM (read only memory) device, a main memory of the computer system such as a RAM (random access memory) device, and/or any other type of data storage device such as a floppy disk or a compact disc, as known to one of ordinary skill in the art.

Furthermore, the data processor 202 is coupled to a database 216 for storing acceptable yield data and results data to be described herein. The database 216 may be formed as part of the data storage unit 214 or may be part of a separate database server, and technology for such a database 216 is known to one of ordinary skill in the art. The data processor 202 is also coupled to another computer system 218 via an Ethernet network 222. Ethernet technology for networking computers is known to one of ordinary skill in the art.

Figure 3:
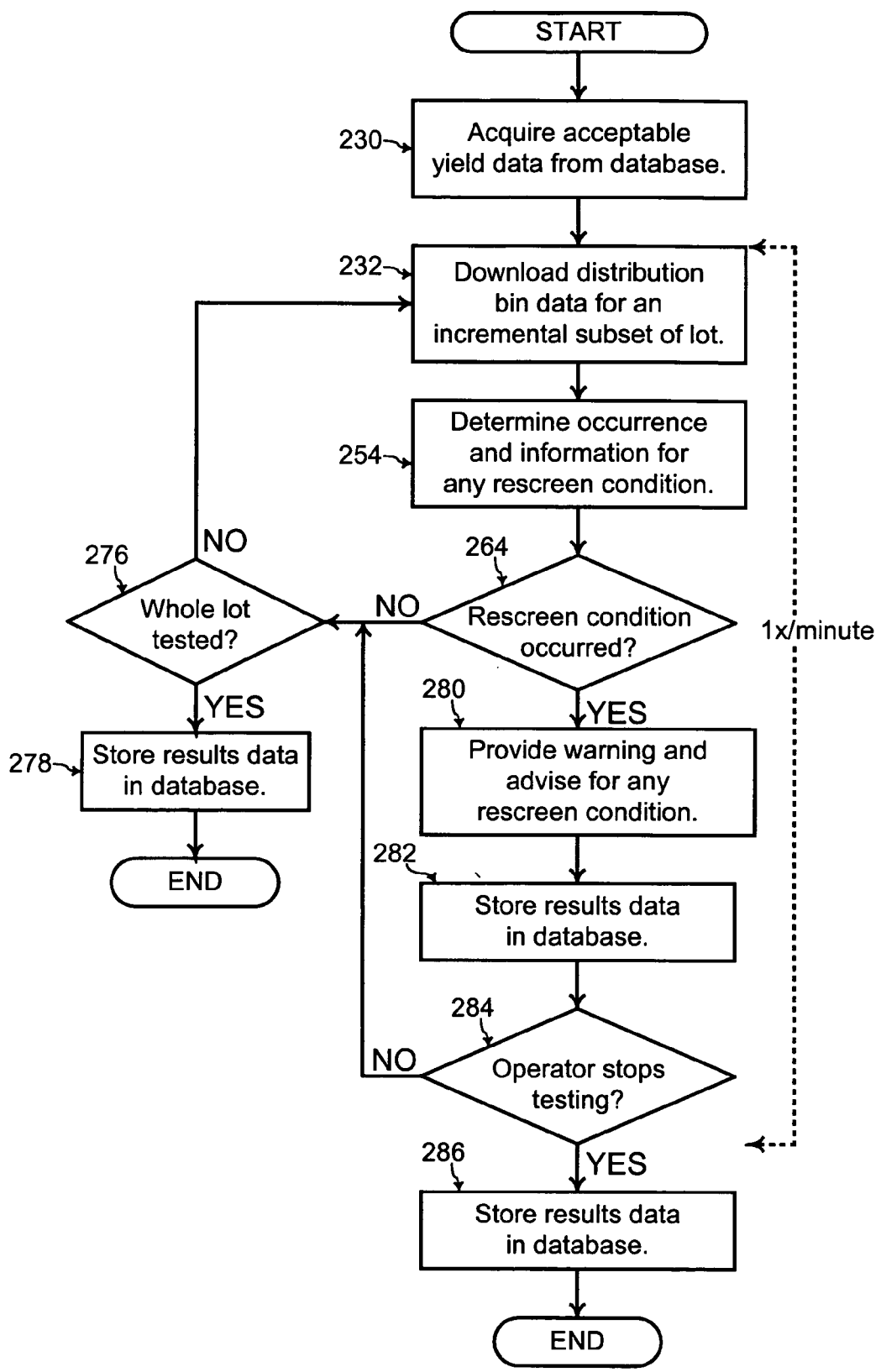
FIG. 3 shows a flowchart of steps during operation of the system of FIG. 2, according to an embodiment of the present invention.

FIG. 3 shows a flow-chart of steps performed by the data processor 202 of FIG. 2 from execution of instructions stored in the data storage unit 214 according to an embodiment of the present invention. Each of the testers 204 and 206 tests an insertion unit of IC packages according to the steps 102, 104, and 106 of FIG. 1. Thus, each of the testers 204 and 206 is testing three insertion units of IC packages per minute.

The steps of the flowchart of FIG. 3 are followed by the data processor 202 for each of the testers 204 and 206 simultaneously in one embodiment of the present invention. The steps of the flowchart of FIG. 3 are now described for one tester 204, but such steps are being performed for each of a plurality of testers simultaneously according to one embodiment of the present invention.

Referring to FIGS. 2 and 3, the data processor 202 acquires acceptable yield data corresponding to the lot of IC packages being tested from the database 216 (step 230 of FIG. 3). In addition, the data processor downloads distribution bin data for an incremental subset of the lot of IC packages after being tested by the tester 204 (step 232 of FIG. 3). FIG. 4 illustrates such distribution bin data within a text file 234 generated by the tester 204. The text file 234 includes a plurality of text lines 236, 238, 240, 242, 244, 246, and 248.

One such text line is generated after the tester 204 tests an insertion unit of IC packages. Each text line states the lot number (i.e., "ABC123" in FIG. 4 for example) followed by a respective distribution bin number assigned to each tested IC package of the insertion unit. The first text line 236 lists all 0's because the first text line 236 is generated before testing of any IC packages. If an insertion unit tests thirty-two IC packages at a time, each text line after the first text line 236 states the thirty-two distribution bin numbers assigned to the thirty-two tested IC packages. In FIG. 4, each of the text lines 238–248 lists six distribution bin numbers assuming that six IC packages are tested at a time for an insertion unit of the tester 204 for simplicity of illustration and description.

In one embodiment of the present invention, the incremental small subset of the lot is three insertion units of IC packages. Thus, the data processor 202 downloads three text lines from the text file 234 generated by the tester 204 after testing three insertion units of IC packages (step 232 of FIG. 3).

Figure 6:
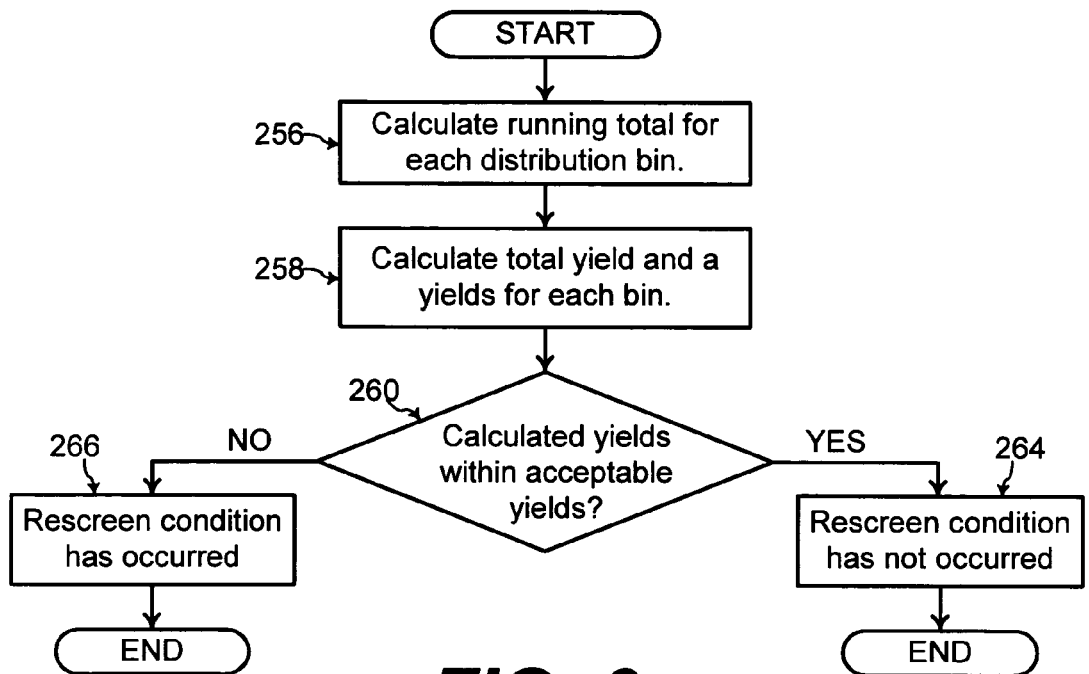
FIG. 6 shows a flowchart of steps for determining occurrence of a rescreen condition using acceptable yield data, according to an embodiment of the present invention.

Referring to FIGS. 2 and 3, the data processor 202 then determines whether a rescreen condition has occurred after downloading the distribution bin data for the incremental small subset of IC packages (step 254 of FIG. 3). FIG. 6 shows a flowchart with steps for determining whether a rescreen condition has occurred using the acceptable yield data within a device rules file 252 of FIG. 5, according to one embodiment of the present invention. The data processor 202 calculates a running total of IC packages assigned to each of the distribution bins (step 256 of FIG. 6). In addition, the data processor 202 calculates a total yield of passing IC packages among all tested IC packages of the lot, and a respective yield percentage of IC packages assigned to each of the distribution bins (step 258 of FIG. 6).

The data processor 202 then compares such calculated yield percentages with the acceptable yield percentages as indicated in the device rules file 252 from the database 216 (step 260 of FIG. 6). FIG. 5 illustrates an example device rules file 252 containing such acceptable yield data within the database 216. The device rules file 252 includes acceptable yields for each of the plurality of distribution bins and an acceptable total yield for lot number "ABC123".

For example, each of the distribution bins 1–5 is assigned for a passing IC package, whereas each of the distribution bins 6–40 is assigned for a failing IC package. In the example of FIG. 5, a rescreen condition is deemed to not occur if the number of IC packages assigned to distribution bin #1 is greater than 10%, assigned to distribution bin #2 is greater than 55%, and so on. Similarly, a rescreen condition is deemed to not occur if the number of IC packages assigned to distribution bin #6 is less than 8%, assigned to distribution bin #7 is less than 5%, and so on.

In addition, a rescreen condition is deemed to not occur if the percentage of the total number of IC packages assigned to bins 1–5 to the total number of IC packages tested is greater than 80%. Such acceptable yield data 252 within the database 216 is specified by a production engineer who creates or edits the device rules file 252 to contain such acceptable yields for a lot of IC packages. The acceptable yields define device rules for a lot of IC packages and such acceptable yields may be specified for any combination of the possible distribution bins.

If the calculated yield percentages are within the acceptable yield percentages as specified in the device rules file 252, the data processor 202 determines that a rescreen condition has not occurred (step 261 of FIG. 6) and returns to step 264 of FIG. 3. On the other hand, if the calculated yield percentages are not within the acceptable yield percentages as specified by the device rules file 252, the data processor 202 determines that a rescreen condition has occurred (step 262 of FIG. 6) and returns to step 264 of FIG. 3. In one embodiment of the present invention, the data processor 202 determines that a rescreen condition has occurred at step 260 if the total yield at any point during testing is less than a relatively low threshold percentage such as 10% for example.

Figure 7:
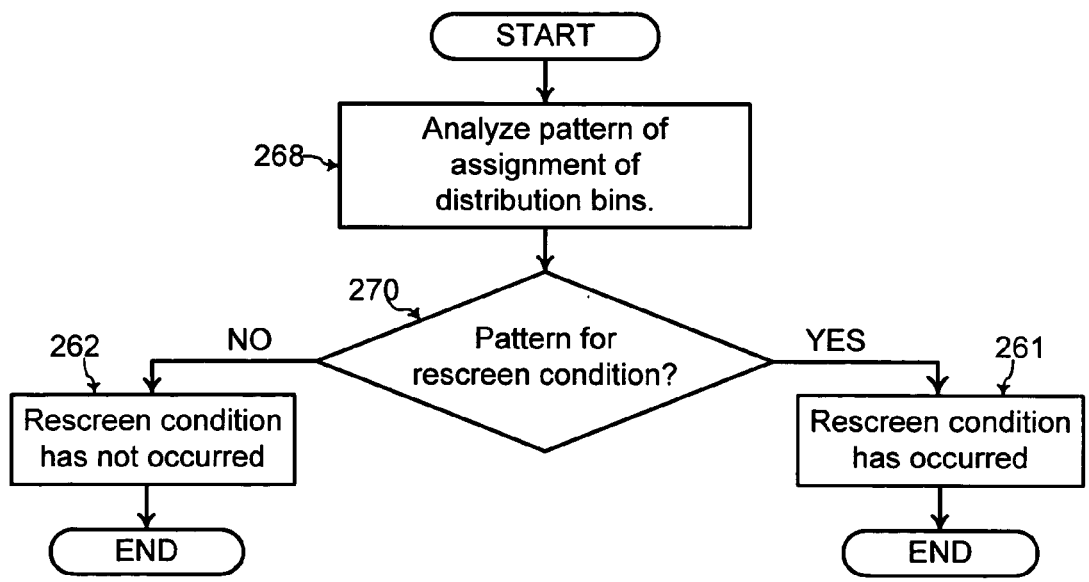
FIG. 7 shows a flowchart of steps for determining occurrence of a rescreen condition from analyzing a pattern of assignment of distribution bins, according to an embodiment of the present invention.

FIG. 7 shows a flowchart with steps for determining whether a rescreen condition has occurred from analyzing a pattern of assignment of the distribution bins from the text file 234 of FIG. 4, according to another embodiment of the present invention. The data processor 202 analyzes such a pattern of assignment of distribution bins after downloading the three text lines (step 268 of FIG. 7).

For example, FIG. 8 illustrates an example pattern of assignment of distribution bins indicating a rescreen condition of device mixing. In that case, at a certain point within the text file 234 (i.e., in the middle of the third text line 240 in FIG. 8), failure distribution bin number 31 is assigned to substantially all of the tested IC packages indicating that unintended IC packages are being mistakenly tested.

Similarly, FIG. 9 illustrates an example pattern of assignment of distribution bins indicating a rescreen condition of insertion failure. In that case, the tested IC packages for one insertion unit (i.e., for the fifth text line 244 in FIG. 9) are assigned to failure distribution bin number 22 indicating that the IC packages have been inserted onto the sockets of the insertion unit with wrong orientation for example.

In addition, FIG. 10 illustrates an example pattern of assignment of distribution bins indicating a rescreen condition of socket failure. In that case, the tested IC packages inserted into a first socket for each insertion unit (i.e., for each of the text lines 238–248 in FIG. 10) are assigned to a failure distribution bin number 20 indicating that the first socket for the insertion unit of the tester 204 is inoperative.

Also, FIG. 11 illustrates an example pattern of assignment of distribution bins indicating a rescreen condition of wrong fixture or die installation. In that case, all tested IC packages (i.e., for all of the text lines 238–248 in FIG. 11) are assigned to a failure distribution bin number 15 indicating that a wrong die or fixture has been installed on the tester 204 during testing of the IC packages.

Figures 12, 13:
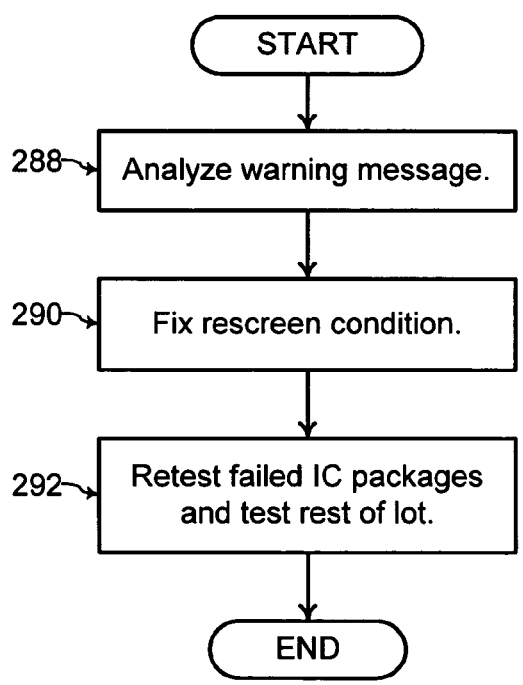
FIG. 12 shows an example data file with the pattern of assignment of distribution bins indicating a rescreen condition of a bug in the tester program.
FIG. 13 shows a flowchart of steps upon occurrence of a rescreen condition, according to one embodiment of the present invention.

Furthermore, FIG. 12 illustrates an example pattern of assignment of distribution bins indicating a rescreen condition of a bug in the tester program. In that case, a substantial majority of the tested IC packages are assigned to a failure distribution bin number 20 indicating that an improper level of test current is sourced into the IC packages during testing.

Referring back to FIGS. 2, 3, and 7, the data processor 202 analyzes the pattern of assignment of distribution bins to determine whether any of such rescreen conditions has occurred (step 268 of FIG. 7). If a pattern for any of the rescreen conditions is detected from the text file 234 (step 270 of FIG. 7), the data processor 202 determines that a rescreen condition has occurred (step 272 of FIG. 7) and returns to step 264 of FIG. 3. Otherwise, the data processor 202 determines that a rescreen condition has not occurred (step 274 of FIG. 7) and returns to step 264 of FIG. 3.

The data processor 202 may determine whether a rescreen condition has occurred at step 254 of FIG. 3 using any combination of steps of FIGS. 6 and 7. In any case, at step 264 of FIG. 3, if the data processor 202 determines that a rescreen condition has not occurred and if the whole lot of IC packages has not yet been tested (step 276 of FIG. 3), the data processor 202 downloads distribution bin data from the text file 234 for a next incremental small subset of tested IC packages (i.e., another three text lines for the next three insertion units of tested IC packages) from the tester 204.

Steps 254, 264, 276, and 232 are repeated as long as the data processor 202 determines that a rescreen condition has not occurred and until the whole lot of IC packages are determined to have been tested (step 276 of FIG. 3). In that case, when the data processor determines that the whole lot of IC packages has been tested without occurrence of a rescreen condition, such information is stored as results data within the database 216 (step 278 of FIG. 3), and testing for the lot of IC packages ends.

On the hand, if the data processor 202 in step 264 determines that a rescreen condition has occurred, the data processor 202 provides a warning of the rescreen condition (step 280 of FIG. 3) and stores such information as results data within the database 216 (step 282 of FIG. 3). Referring to FIGS. 2 and 3, such a warning may include displaying a red screen on the display 210 of the tester 204 or a loud siren generated at the tester 204. In addition, such a warning may include sending an E-mail to a personal computer 218 of a production engineer via the Ethernet network 222. The warning message displayed on the display 210 or the E-mail sent to the personal computer 218 includes a description of any possible rescreen conditions that could have occurred and also include the pattern of assignment of distribution bins, in one embodiment of the present invention.

In addition, the data processor 202 provides within the warning message information regarding the detected rescreen condition including advice for handling the rescreen condition. For example, the data processor 202 determines and includes in the warning message an indication that the rescreen condition is one of unacceptable low yield, device mixing, insertion failure, socket failure, wrong fixture or die installation, or a bug in the tester program.

Furthermore, the data processor 202 determines and includes in the warning message advice for handling the rescreen condition. For example, if the data processor 202 determines that the rescreen condition is failure of the first socket in the insertion unit, the data processor 202 includes the advice to fix the faulty first socket, in the warning message. Or, if the data processor 202 determines that the rescreen condition is a total yield that is less than a relatively low threshold voltage such as 10% for example, the data processor 202 includes the advice to immediately stop the tester from continuing with testing, in the warning message.

After generation of the warning message, a production engineer may or may not stop the tester 204 from further testing the current lot of IC packages (step 284 of FIG. 3). If the production engineer does not stop further testing, the production engineer has decided to ignore the warning of the occurrence of the rescreen condition such that the tester continues with testing of the lot of IC packages at step 276 of FIG. 3. In that case, the data processor 202 continues to download and analyze distribution bin data from the tester 204.

On the other hand, the production engineer may choose to stop the tester 204 from further testing the current lot of IC packages with occurrence of the rescreen condition (step 284 of FIG. 3). In that case, the data processor 286 stores information of the rescreen condition and a status of the testing as results data within the database 216 (step 286 of FIG. 3).

FIG. 13 illustrates a flowchart of steps that may be performed when the production engineer stops the tester 204 after generation of a warning message of the occurrence of a rescreen condition. The production engineer analyzes the warning message to determine the nature of the rescreen condition(s) and studies the advice provided by the data processor 202 for handling the rescreen condition (step 288 of FIG. 13). From such information, the production engineer corrects for the rescreen condition(s) (step 290 of FIG. 13).

Such correction for the rescreen condition(s) may include debugging the test program running on the tester 204 when the rescreen condition is a bug in such a test program. For example, FIG. 12 indicates an example pattern of assignment of distribution bins when an improper level of test current is sourced into the IC packages during testing. In that case, the test program is debugged to source a lower level of current into the IC packages during testing. After correcting for the rescreen condition(s), the tester 204 retests the failed IC packages and continues with testing the rest of the IC packages of the lot that have not yet been tested (step 292 of FIG. 13).

Figure 1:
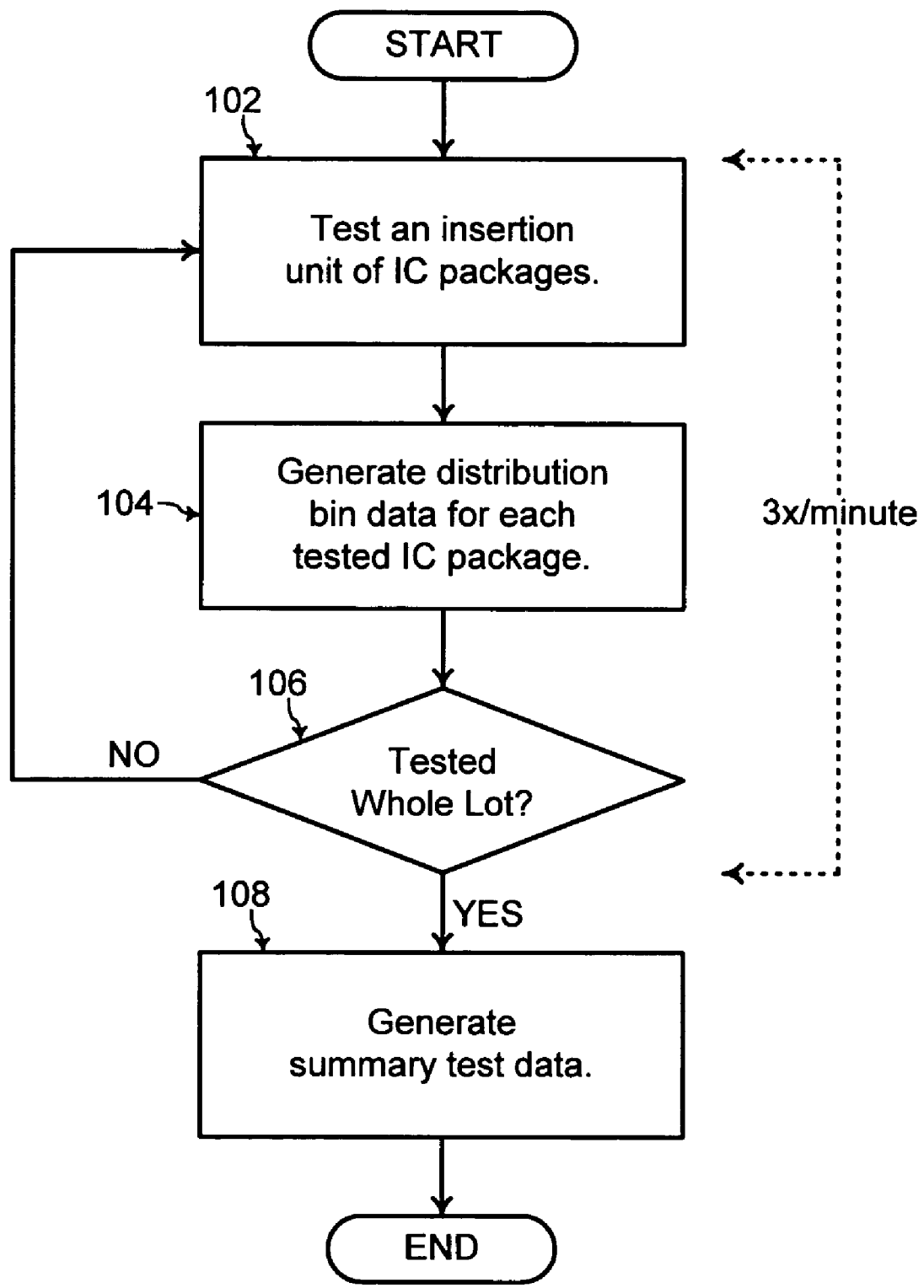
FIG. 1 shows a flowchart of steps for testing a lot of IC (integrated circuit) packages, according to the prior art.

In this manner, the occurrence of a rescreen condition is detected in real-time shortly after testing an incremental small subset of the lot of IC packages. Referring to FIG. 3, steps 230, 232, 254, 264, 280, 282, and 284 are performed once every minute according to one embodiment of the present invention. Thus, the incremental small subset of the lot of IC packages is three insertion units of IC packages since the tester 204 tests three insertion units of IC packages per minute as illustrated in FIG. 1.

A whole lot of IC packages typically includes thousands of IC packages such as 7,000 IC packages for example. An insertion unit of the tester 204 tests for thirty-two IC packages at a time. In that case, the incremental small subset of the lot formed with three such insertion units includes 32×3=96 IC packages which is about 1.4% of the whole lot of IC packages.

The data processor 202 determines whether a rescreen condition occurs after the tester 204 tests each such incremental small subset of IC packages. If the data processor 202 determines that a rescreen condition has occurred, the data processor 202 provides a warning in real-time relatively shortly (within about a minute) after the tester 204 has tested the incremental small subset of IC packages.

Thus, the occurrence of a rescreen condition is detected and corrected in real-time after testing each incremental small subset of the IC packages. As a result, time is not wasted in testing the whole lot of articles with a rescreen condition. In addition, because a rescreen condition is detected and corrected for early, a small number of failed IC packages are retested. Consequently, utilization of the tester 204 is maximized.

Furthermore, the data processor 202 automatically downloads and analyzes distribution bin data from the tester 204. Thus, the occurrence of the rescreen condition is automatically determined such that a production engineer who is skilled but may still make an error in human judgment is no longer required.

The production engineer now simply specifies the acceptable yield percentages in the device rules file 252 within the database 216, and the data processor 202 automatically determines when a rescreen condition occurs in real-time. In one embodiment of the present invention, the production engineer uses historical data to determine the acceptable yield percentages within the database 216 to be used by the data processor 202.

Figures 14, 15:
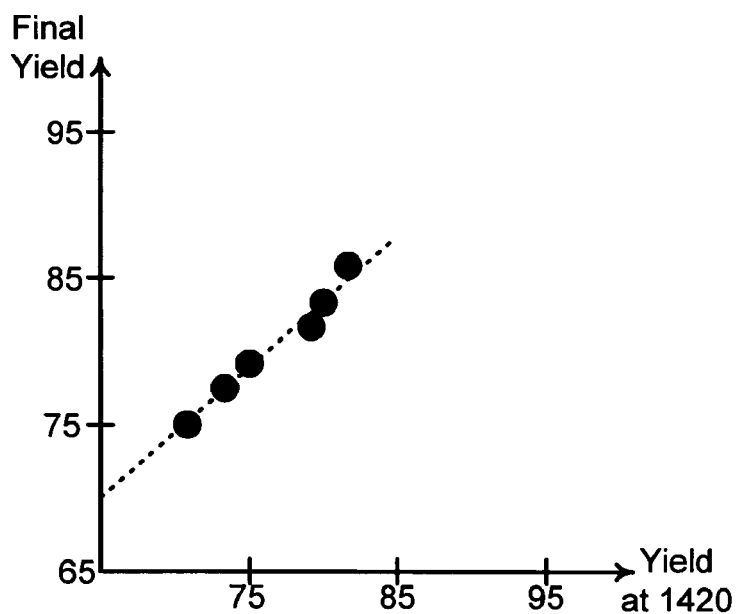
FIGS. 14 and 15 illustrate use of historical yield data for determining acceptable yield data using linear regression analysis, according to one embodiment of the present invention.

For example, FIG. 14 shows a table including various lots of IC packages each with a corresponding total yield after all IC packages of the lot were tested and with a corresponding yield after 1,420 IC packages were tested. Assume that an average size of the various lots of the table of FIG. 14 is calculated to be 7,100 IC packages for example.

In FIGS. 3 and 6, assume that the data processor 202 uses the acceptable yield percentages within the database 216 to determine the occurrence of a rescreen condition only after at least 1,420 IC packages have been tested. In one embodiment of the present invention, a production engineer may specify to the data processor 202 that such a minimum number of IC packages be tested before the steps of FIG. 3 are performed. (Nevertheless, the data processor 202 may determine that a rescreen condition has occurred after any number of IC packages has been tested if the total yield is less than a relatively low threshold percentage such as 10% for example.)

The production engineer uses the historical yield data of the table of FIG. 14 for specifying the acceptable yield percentages within the device rules file 252 of the database 216. FIG. 15 illustrates a plot of the final total yield vs. the yield at 1,420 IC packages tested with the data of the table of FIG. 14 for using linear regression analysis. From such a linear relationship of FIG. 15, given a minimum final total yield for a lot, the acceptable total yield at 1,420 IC packages tested to be used in the flowchart of FIG. 6 is determined. Linear regression analysis is in general known to one of ordinary skill in the art. In another embodiment of the present invention, the data processor 202 determines the acceptable yield percentage to be used in the flowchart of FIG. 6 after 1,420 IC packages have been tested using linear regression analysis with historical yield data.

The foregoing is by way of example only and is not intended to be limiting. For example, the present invention is described in reference to testing IC (integrated circuit) packages during manufacture of IC packages. However, the present invention may be applied for testing any articles of manufacture, as would be apparent to one of ordinary skill in the art from the description herein. Furthermore, any numbers of elements as illustrated and described herein are by way of example only. The present invention is limited only as defined in the following claims and equivalents thereof.

We claim:

1. A method of testing articles of manufacture, comprising:
  A. analyzing distribution bin data resulting from testing of a small subset of a lot of the articles to determine whether a rescreen condition has occurred after testing of the small subset including a plurality of the articles wherein each tested article is assigned to a respective one of a plurality of distribution bins after being tested to generate the distribution bin data; and
  B. generating a warning about a rescreen condition when the rescreen condition has occurred.

2. The method of claim 1, wherein the warning is generated in real-time shortly after testing of the small subset.

3. The method of claim 1, further comprising:
  generating advice for handling the rescreen condition.

4. The method of claim 1, further comprising:
  performing steps A and B after testing of each incremental small subset of the lot.

5. The method of claim 4, wherein the incremental small subset is X% of the whole lot with X% being less than 2%.

6. The method of claim 1, wherein step A includes:
  determining whether at least one of a plurality of rescreen conditions has occurred.

7. The method of claim 1, further comprising:
  correcting for the rescreen condition; and
  retesting failed articles after correcting for the rescreen condition.

8. The method of claim 1, wherein the articles are IC packages, and wherein a pattern of the assignment of the distribution bins is analyzed for determining whether the rescreen condition has occurred.

9. The method of claim 1, further including:
  comparing the distribution bin data to acceptable yield data stored in a database for determining whether the rescreen condition has occurred.

10. The method of claim 9, wherein the acceptable yield data is determined using linear regression of historical yield data.

11. The method of claim 1, further comprising:
  storing results data in a database.

12. The method of claim 1, further comprising:
  performing steps A and B for each of a plurality of test systems.

13. A system for testing articles of manufacture, comprising:
  a tester for testing the articles;
  a processor coupled to the tester; and
  a data storage unit having sequences of instructions stored thereon, wherein execution of the sequences of instructions by the processor causes the processor to perform the steps of:
  A. analyzing distribution bin data resulting from testing of a small subset of a lot of the articles to determine whether a rescreen condition has occurred after the tester tests the small subset including a plurality of the articles;
  wherein each tested article is assigned to a respective one of a plurality of distribution bins after being tested to generate the distribution bin data; and
  B. providing a warning about a rescreen condition when the rescreen condition has occurred.

14. The system of claim 13, wherein the processor provides the warning in real-time shortly after testing of the small subset.

15. The system of claim 13, wherein the processor provides information advice for handling the rescreen condition.

16. The system of claim 13, wherein the processor performs steps A and B after the tester tests each incremental small subset of the lot.

17. The system of claim 16, wherein the incremental small subset is X% of the whole lot with X% being less than 2%.

18. The system of claim 13, wherein the processor determines whether at least one of a plurality of rescreen conditions has occurred.

19. The system of claim 13, wherein the tester retests failed articles after the rescreen condition is corrected.

20. The system of claim 13, wherein the articles are IC packages, and wherein the processor analyzes a pattern of the assignment of the distribution bins for determining whether the rescreen condition has occurred.

21. The system of claim 13, further comprising:
a database for storing acceptable yield data compared to the distribution bin data for determining whether the rescreen condition has occurred.

22. The system of claim 21, wherein the acceptable yield data is determined using linear regression of historical yield data.

23. The system of claim 13, further comprising:
a database for storing results data from the processor.

24. The system of claim 13, wherein the processor performs steps A and B for each of a plurality of test systems.

25. A computer readable medium having stored thereon sequences of instructions for performing the steps of:
A. analyzing by a processor distribution bin data resulting from testing of a small subset of a lot of the articles to determine whether a rescreen condition has occurred after testing of the small subset including a plurality of the articles of;
wherein each tested article is assigned to a respective one of a plurality of distribution bins after being tested to generate the distribution bin data; and
B. providing by the processor a warning about a rescreen condition when the rescreen condition has occurred.

26. The computer readable medium of claim 25, wherein the sequences of instructions are also for performing the step of:
providing by the processor the warning in real-time shortly after testing of the small subset.

27. The computer readable medium of claim 25, wherein the sequences of instructions are also for performing the step of:
providing by the processor advice for handling the rescreen condition.

28. The computer readable medium of claim 25, wherein the sequences of instructions are also for performing by the processor steps A and B after testing of each incremental small subset of the lot.

29. The computer readable medium of claim 28, wherein the incremental small subset is X% of the whole lot with X% being less than 2%.

30. The computer readable medium of claim 25, wherein the sequences of instructions are also for performing the step of:
determining by the processor whether at least one of a plurality of rescreen conditions has occurred.

31. The computer readable medium of claim 25, wherein the articles are IC packages, and wherein the sequences of instructions are also for performing the step of:
determining by the processor whether the rescreen condition has occurred from analysis of a pattern of the assignment of the distribution bins.

32. The computer readable medium of claim 25, wherein the sequences of instructions are also for performing the step of:
comparing the distribution bin data to acceptable yield data from a database for determining whether the rescreen condition has occurred.

33. The computer readable medium of claim 25, wherein the sequences of instructions are also for performing the step of:
storing results data in a database.

34. The computer readable medium of claim 25, wherein the sequences of instructions are also for performing by the processor steps A and B for each of a plurality of test systems.

* * * * *